(12) United States Patent
Jenkins

(10) Patent No.: US 6,992,529 B2
(45) Date of Patent: Jan. 31, 2006

(54) APPARATUS, METHODS AND ARTICLES OF MANUFACTURE FOR A DUAL MODE AMPLIFIER

(75) Inventor: Alan Peter Jenkins, Groton, MA (US)

(73) Assignee: M/A-COM, Inc., Lowell, MA (US)

( * ) Notice: Subject to any disclaimer, the term of this patent is extended or adjusted under 35 U.S.C. 154(b) by 70 days.

(21) Appl. No.: 10/744,820

(22) Filed: Dec. 23, 2003

(65) Prior Publication Data

US 2005/0134388 A1   Jun. 23, 2005

(51) Int. Cl.
*H03G 3/20* (2006.01)

(52) U.S. Cl. ............................ 330/285; 330/307
(58) Field of Classification Search .............. 330/51, 330/126, 129, 307; 455/93, 552.1, 553.1
See application file for complete search history.

(56) References Cited

U.S. PATENT DOCUMENTS 5,670,911 A   9/1997  Hori et al. ................. 330/277
6,069,525 A * 5/2000  Sevic et al. ................ 330/51
6,188,877 B1 * 2/2001  Boesch et al. .............. 455/74
6,885,246 B2 * 4/2005  Tsutsui et al. ............ 330/285

FOREIGN PATENT DOCUMENTS

GB   2 269 502 A   9/1994

* cited by examiner

*Primary Examiner*—Steven J. Mottola

(57) ABSTRACT

The invention is directed to a system for electromagnetic communications that includes a semiconductor die; at least one amplifier on the die to amplify an input signal and generate an output signal; and an active bias control component on the die for adjusting biasing of the amplifier so that the amplifier is operable in a plurality of frequency bands. In one embodiment, a PCS band and W-CDMA power amplifier may be integrated on the same power amplifier die, and different output power requirements may be addressed by the use of an Si DC-DC converter. Such a converter may provide efficiency enhancements to the overall system through the use of dynamic bias control under active power control situations from the network. In addition, the converter may be used in a voltage up-converter state that allows a W-CDMA optimized power amplifier to operate at PCS frequencies and output power levels.

12 Claims, 7 Drawing Sheets

APPARATUS, METHODS AND ARTICLES OF MANUFACTURE FOR A DUAL MODE AMPLIFIER

FIELD OF THE INVENTION

The field of the invention is that of dual mode linear amplifiers, and more particularly that of single die dual mode linear amplifiers for wideband signal transmission.

BACKGROUND OF THE INVENTION

Because of the need to increase the power and battery life of cellular phones, while also reducing the size of the phones and their components, there is currently significant research being conducted on the design of more efficient linear power amplifiers that may be used in handset applications. The use of linear power amplifier technology over non-linear amplifiers is particularly important for efficient handset applications using transmission systems that incorporate non-constant envelope modulation schemes, such as those found in code division multiple access modulation schemes like W-CDMA, IS-95 and CDMA2000.

Power amplifiers for these applications are typically fabricated on materials such as Gallium Arsenide (GaAs), and its variants, which have been found to be advantageous for use in power amplifiers for cellular applications, due to the efficiency gains that may be achieved using these semiconductors.

There also has been significant efforts placed in implementing more efficient dual-, tri-, and quad-band power amplifiers. However, the power amplifier for one transmission band in these solutions has been implemented as a stand-alone device, due to significantly different requirements between the transmission standards. This has required the use of two or more amplifier dies, which increases the size of the amplifier and significantly increases the cost, reducing their desirability in cellular applications. As an example, in solutions for GSM applications, the W-CDMA power amplifier is a separate, stand-alone unit because of its different RF requirements.

It would be advantageous to further enhance the efficiency and power output of linear amplifiers used in such applications, and for providing a power amplifier optimized for one transmission band, such as W-CDMA, to be more efficiently operable at one or more other bands, such as at PCS frequencies and output power levels.

SUMMARY OF THE INVENTION

Embodiments of the invention may include a system for electromagnetic communications that includes a semiconductor die; at least one power amplifier on the die to amplify an input signal and generate an output signal; and an active bias control component on the die for adjusting biasing of the power amplifier so that the amplifier is operable in a plurality of frequency bands.

In one embodiment, the invention may integrate a PCS band power amplifier with a W-CDMA power amplifier using the same power amplifier die, where different output power requirements may be addressed by the use of an Si DC-DC converter. Such a converter may provide efficiency enhancements to the overall system through the use of dynamic bias control under active power control situations from the network. In addition, the converter may be used in a voltage up-converter state that allows a W-CDMA optimized power amplifier to operate at PCS frequencies and output power levels.

BRIEF DESCRIPTION OF THE DRAWINGS

The foregoing and other aspects and advantages will be better understood from the following detailed description of the invention with reference to the drawings, in which.

DETAIL DESCRIPTION

Figure 1:
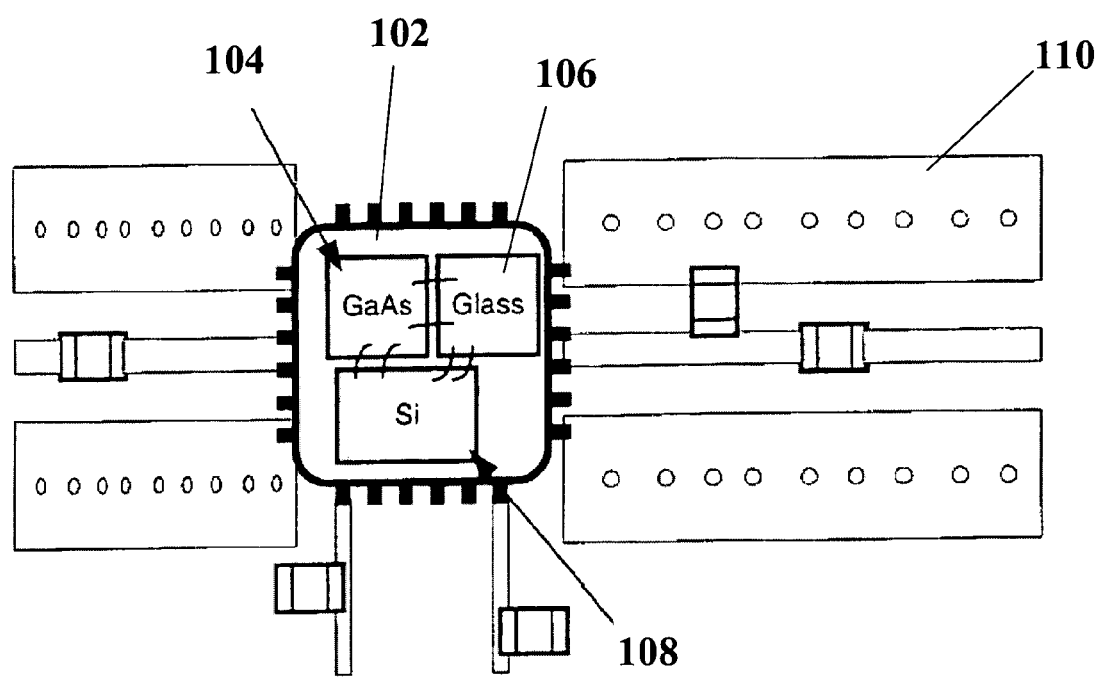
FIG. 1 is an illustration of an amplifier in accordance with aspects of the invention.

The invention will be understood more fully from the detailed description given below and from the accompanying drawings of the preferred embodiments of the invention; which, however, should not be taken to limit the invention to a specific embodiment, but are for explanation and understanding only.

The design of a power amplifier, such as those used in communication system handsets (e.g., cellular phones) generally involves the consideration of the design of the device periphery, matching circuit design, and battery voltage. It has been realized that significant enhancements in handset talk time may sometimes be achieved by active bias control of a power amplifier die. This situation typically arises as a result of the probability density distribution of the required output power of certain systems, such as CDMA based communications systems.

Although a power amplifier are typically designed to achieve a predetermined adjacent-channel power ratio ("ACPR") at the maximum output power, under normal operating conditions the output power from the amplifier is often significantly less than this. As an example, specifications for a W-CDMA based system often specifies a maximum output power of 25 dBm at the antenna (i.e. +27 dBm at the power amplifier). However, for 90% of the time the actual power amplifier typically operates at around 0 dBm to +10 dBm.

Conventional power amplifiers are typically designed to have maximum efficiency at the maximum output power. Accordingly, by adjusting the bias conditions of the device (effectively reducing the collector voltage on the active output devices and tuning the ACPR curve using base bias control) the efficiency of the power amplifier may be enhanced across substantially all power levels. Using this technique, it has been discovered that the average battery current may be reduced by about 30% (including the energy lost in the converter). This produces a direct increases in talk time.

It has further been discovered that by adding active bias control to a power amplifier die, the use of the power amplifier may be extended to wider frequency ranges. For example, if an Si active bias control die is added to the die for a W-CDMA power amplifier, its use may be extended so that it may be used with signals in the PCS frequency range. In this example, the frequency is close enough (185 OMHz) such that a relatively good compromise between RF tuned efficiency in each band may be achieved.

A different frequency band would typically require a much higher output power and therefore require a much larger periphery for the power amplifier die. For example, a PCS band power amplifier typically requires a +29 dBm output power and thus generally twice the periphery of a W-CDMA die at the same battery voltage of 3.4V.

However, it has been discovered that higher output power may achieved from a smaller periphery power amplifier at acceptable values of power added efficiency ("PAE") by using a mechanism for up-converting the power amplifier bias voltage, such as a DC-DC up converter (although not limited thereto). In the case of a W-CDMA power amplifier used to transmit a PCS band signal, for example, the up-converter should preferably provide around about 4.5V at 500 mA or so at the maximum output power.

An example of one embodiment of a power amplifier in accordance with aspects of the invention is shown in FIG. 1. As shown in FIG. 1, a single power amplifier die 102 may contain GaAs based amplifier 104, glass 106, and bias control 108. Power amplifier die 102 may be connected to external circuitry 110 in a conventional manner well known to those of ordinary skill in the art, which will not be further elaborated upon here.

Providing a power amplifier in the manner described above has the significant advantage that it eliminates the need for a second, large area GaAs die when using a power amplifier for one type of modulation signal for a higher power frequency band (e.g., using a W-CDMA power amplifier to transmit a PCS band signal). At the same time, the same average battery current enhancements may be achieved in the higher band as are normally achieved in the lower band. By using a single die to transmit signals in two or more bands, the active amplifier area is reduced, packaging and associated surface mounted device ("SMD") components may be removed, and the overall board area reduced by at least a factor of two.

In one embodiment, a single GaAs based power amplifier die may be used for dual mode CDMA (PCS) and W-CDMA applications. While there may be loss of efficiency due to the DC-DC converter, this loss appears to be minor, especially in view of the reduction in overall battery usage. Efficiencies of above 90% may still be achieved when down converting and of the order of 80% when up converting. Thus, when operating in the PCS mode, the power amplifier of the invention would show less then the 30% decrease in average battery current that is demonstrated in W-CDMA mode. Consequently, actual talk time is still enhanced, and at reduced cost.

FIGS. 2(a)–(f) illustrate results achieved with a simulated power amplifier along the lines of the invention. Shown are results for a W-CDMA optimized power amplifier design. In this example, ACPR calculations were completed using IS-95 modulation. It has been shown experimentally that the PAE for IS-95 at about 46 dBc ACPR is equivalent to the PAE for W-CDMA at about 36 dBc, which is within specifications for the transmission of such signals.

Figure 2A:
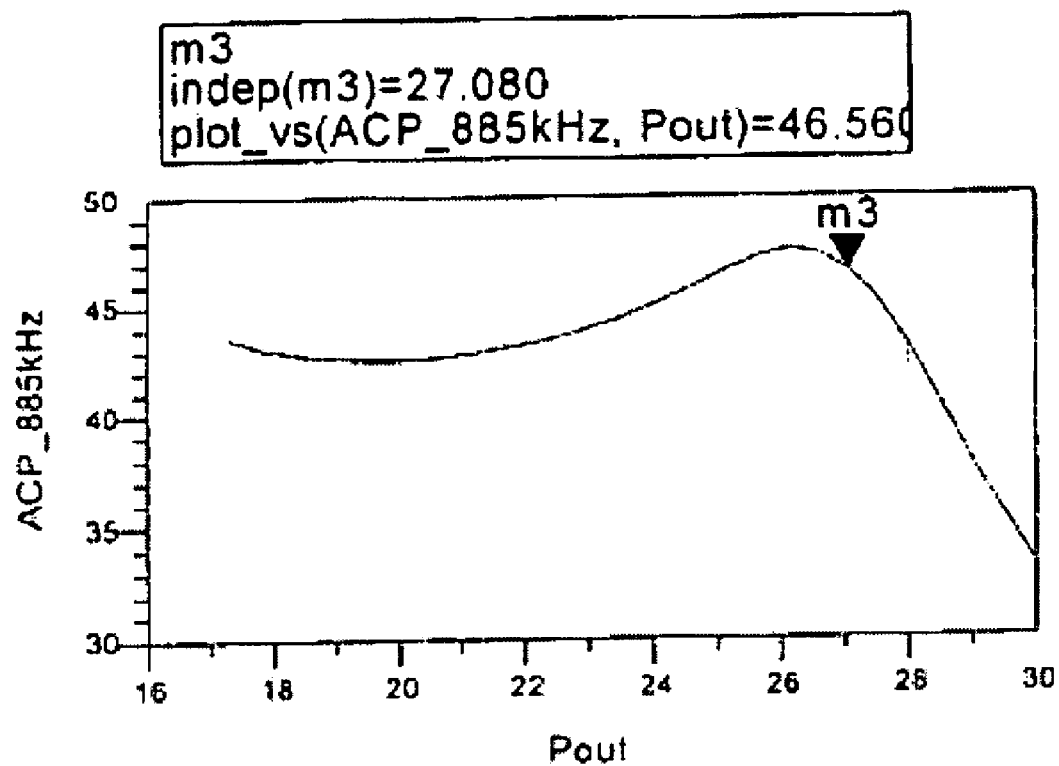
FIGS. 2(a)–(f) are charts illustrating the performance of a simulated amplifier in accordance with aspects of the invention.
Figure 2B:
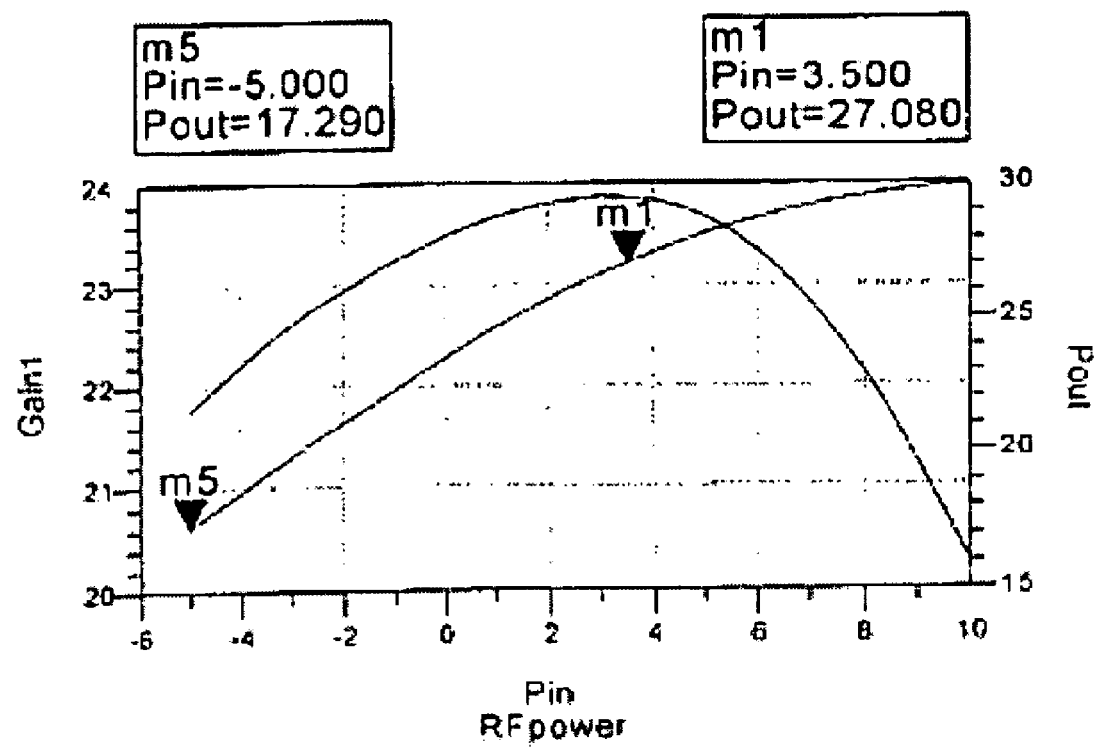
Figure 2C:
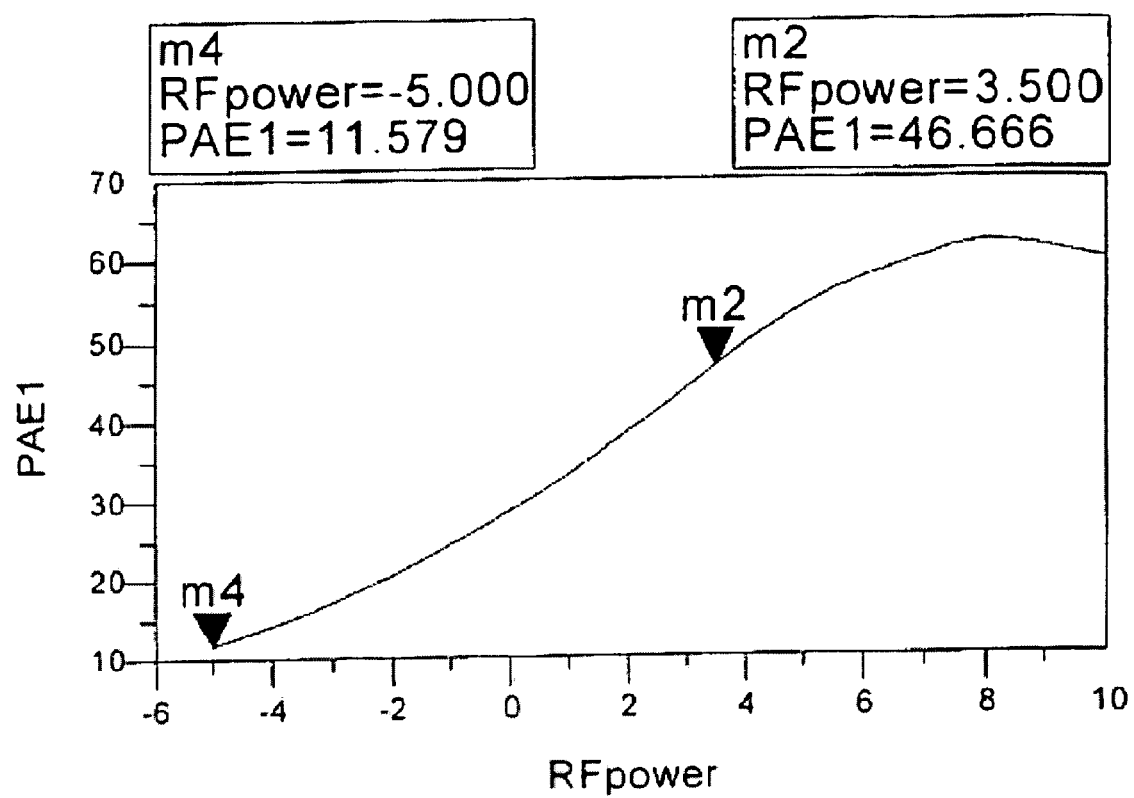
Figure 2D:
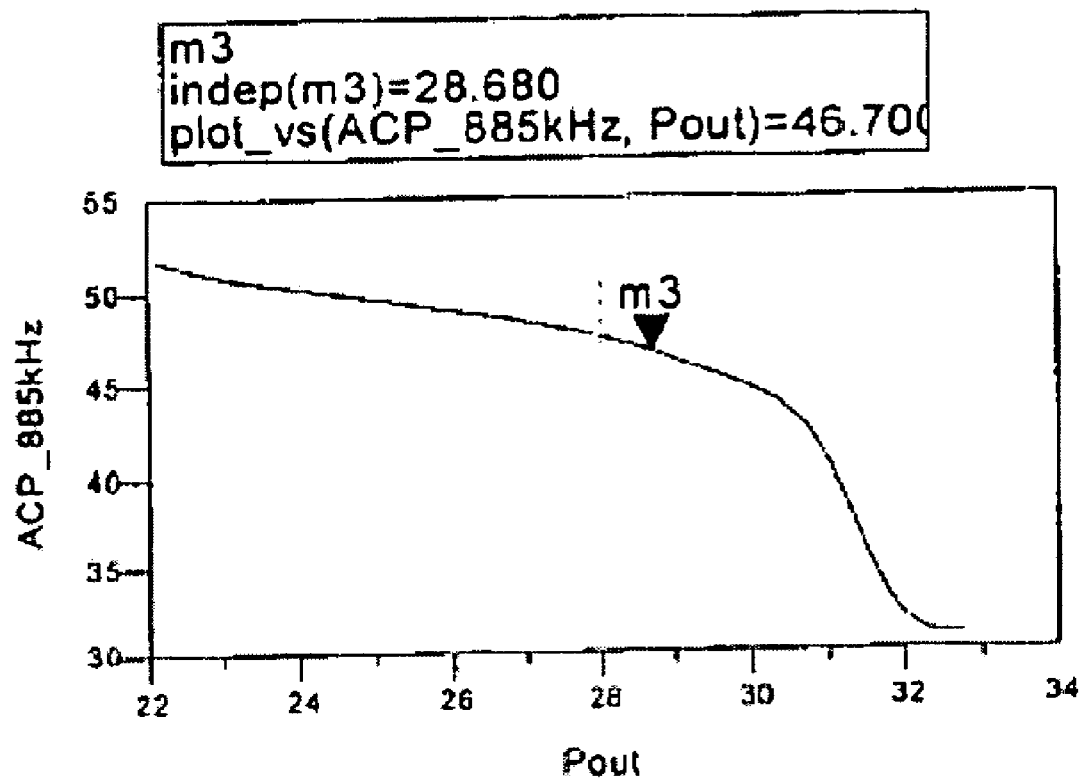
Figure 2E:
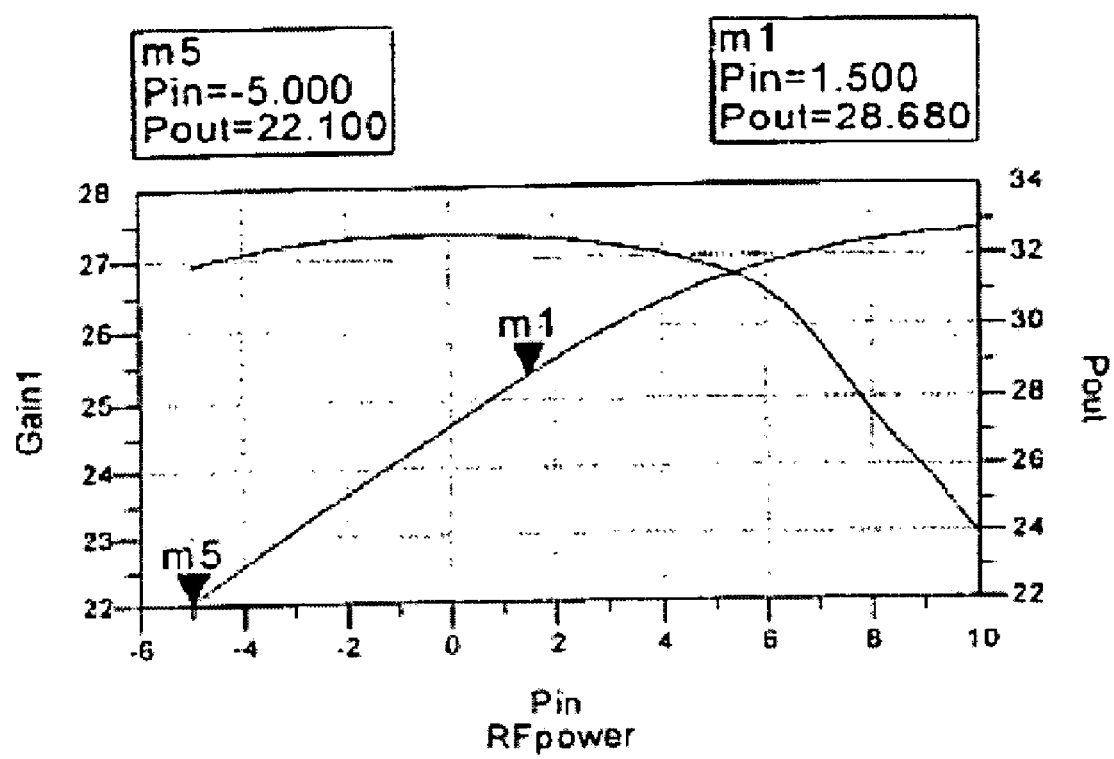
Figure 2F:
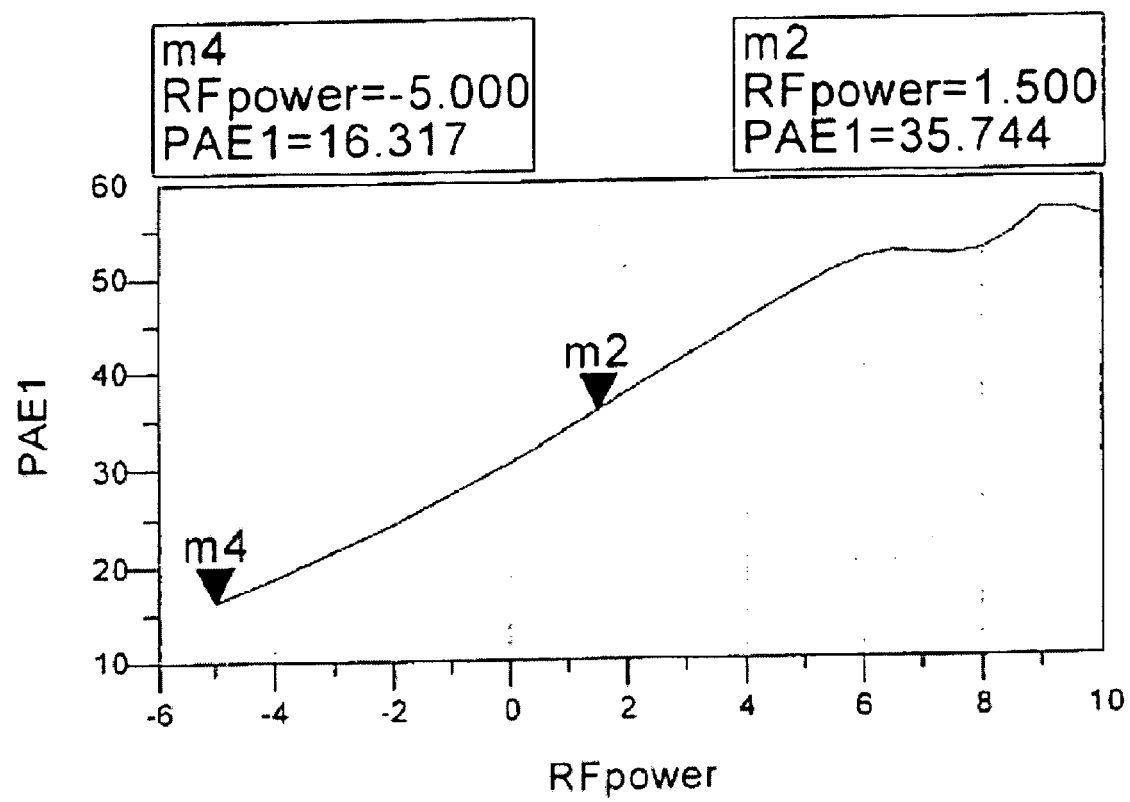

As can be seen, FIG. 2(a) illustrates that at a required ACPR of about 46 dBc the power amplifier output power is +27 dBm. This corresponds to an input power of about 3.5 dBm, as shown in FIG. 2(b). The associated PAE is illustrated in FIG. 2(c) and is approximately 46%. Parameters for this simulation were Vcc1=Vcc2=3.4V, Fo=1950 MHz and the inductor Q values was 50.

When operated directly at 1850 MHz (bottom end of the PCS band) this amplifier would not reach the required output power. However, as seen in FIGS. (d)–(f), if this same power amplifier is now biased at Vcc1=Vcc2=4.5V, the required power output may be achieved at this higher frequency band.

As discussed above, in differing embodiments, for example, when used with certain transmitter, receiver, and transceiver embodiments, the components described herein may be specialized for particular input signals, carrier waves and output signals, e.g. various types of cell phones, such as CDMA, CDMA2000, W-CDMA, GSM, TDMA, as well as various other types of devices, both wired and wireless, e.g. Bluetooth, 802.11a, -b, -g, radar, 1xRTT, radios, GPRS, computers and computer or non-computer communication devices, handheld devices, etc. The modulation scheme(s) that may be used in implementations of the invention is not limited to CDMA based systems and may include other transmission schemes, such as GMSK, which is used in GSM; GFSK, which is used in DECT & Bluetooth; 8-PSK, which is used in EDGE; OQPSK & HPSK, which are used in IS-2000; p/4 DQPSK, which is used in TDMA; and OFDM, which is used in 802.11, etc.

Various types of system architectures may also be utilized for constructing the embodiments. For example, various components may be provided on a different types of semiconductor devices where desired, as an integrated circuit or an application-specific integrated circuit composition; including silicon (Si), silicon germanium (SiGe) or gallium arsenide (GaAs) substrates.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention.

Accordingly each of the blocks of the drawings, and combinations of blocks of the drawings, may be embodied in many different ways, as is well known to those of skill in the art. The foregoing description is by way of example only, and not limiting. The invention is limited only as defined in the following claims and equivalents thereto.

What is claimed is:

1. An apparatus for electromagnetic communications comprising:
    a semiconductor die;
    at least one amplifier on said die to amplify an input signal and generate an output signal;
    a power source for providing a voltage to said amplifier;
    an active bias control component on said die for adjusting a bias voltage of said amplifier so that said amplifier is operable in a plurality of frequency bands; and
    a DC-DC converter on said die for receiving said power source voltage and for adjusting said bias voltage of said amplifier by up-converting said amplifier bias voltage to a voltage greater than said power source voltage.

2. The apparatus of claim 1, wherein said DC-DC converter is comprised of Silicon.

3. The apparatus of claim 1, wherein said semiconductor die is contains one or more selected from the group consisting of Gallium, Arsenide, Silicon or Silicon-Germanium.

4. The apparatus of claim 1, wherein said amplifier is optimized for operation with W-CDMA and said active bias control is adjustable for also operating said amplifier in the PCS frequency band.

5. An amplifier comprising a semiconductor die having power circuitry for providing a voltage circuitry to amplify an input signal and generate an output signal and to adjust a bias voltage of said circuitry so that said amplifier is operable in a plurality of frequency bands, and DC-DC conversion circuitry for up-converting said bias voltage to a voltage greater than said voltage provided by said power circuitry.

6. The amplifier of claim 5, wherein said DC-DC conversion circuitry is comprised of Silicon.

7. The amplifier of claim 5, wherein said semiconductor die is contains one or more selected from the group consisting of Gallium-Arsenide, Silicon or Silicon-Germanium.

8. The amplifier of claim 5, wherein said amplifier is optimized for operation with W-CDMA and said circuitry is adjustable for also operating said amplifier in the PCS frequency band.

9. A power amplifier comprising a semiconductor die having a power source for providing a voltage, circuitry to amplify an input signal to generate an output signal and to adjust biasing of said circuitry by up-converting amplifier bias voltage so that said amplifier is operable in a plurality of frequency bands, wherein said amplifier bias voltage is up-converted to a voltage greater than said power source voltage.

10. The power amplifier of claim 9, wherein said portion of said circuitry performing said up-conversion is comprised of Silicon.

11. The power amplifier of claim 9, wherein said semiconductor die is contains one or more selected from the group consisting of Gallium, Arsenide, Silicon or Silicon-Germanium.

12. The power amplifier of claim 9, wherein said power amplifier circuitry is configured for operation with W-CDMA and said circuitry is adjustable for also operating said power amplifier in the PCS frequency band.

* * * * *